US006865020B2

United States Patent
Kim et al.

(12) United States Patent
Kim et al.

(10) Patent No.: US 6,865,020 B2
(45) Date of Patent: Mar. 8, 2005

(54) GAIN-CLAMPED SEMICONDUCTOR OPTICAL AMPLIFIER

(75) Inventors: Ho-In Kim, Yongin-shi (KR); Jeong-Seok Lee, Anyang-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/658,629

(22) Filed: Sep. 9, 2003

(65) Prior Publication Data
US 2004/0196542 A1 Oct. 7, 2004

(30) Foreign Application Priority Data
Feb. 19, 2003 (KR) .................. 10-2003-0010350

(51) Int. Cl.[7] .................................. H01S 3/00
(52) U.S. Cl. ...................................... 359/344
(58) Field of Search ........................... 359/344

(56) References Cited

U.S. PATENT DOCUMENTS 5,715,268 A * 2/1998 Lang et al. ................. 372/50
6,563,631 B2 * 5/2003 Delprat et al. .............. 359/344

* cited by examiner

Primary Examiner—Mark Hellner
(74) Attorney, Agent, or Firm—Cha & Reiter, L.L.C.

(57) ABSTRACT

A gain-clamped semiconductor optical amplifier capable of providing constant gain for output optical signals at substantially all times is disclosed. In particular, the gain-clamped semiconductor optical amplifier according to the present invention comprises a active waveguide having an input and output side; clad layers surrounding the active waveguide; and a grating, which is formed partially at both end parts under the input and output sides of the active waveguide.

14 Claims, 7 Drawing Sheets

GAIN-CLAMPED SEMICONDUCTOR OPTICAL AMPLIFIER

CLAIM OF PRIORITY

This application claims priority to an application entitled "Gain-clamped semiconductor optical amplifier," filed in the Korean Intellectual Property Office on Feb. 19, 2003 and assigned Serial No. 2003-10350, the contents of which are hereby incorporated by reference.

BACKGROUND OF THE INVENTION

1. Field of the Invention

The present invention relates to a semiconductor optical amplifier for amplifying optical signals, and more particularly to a gain-clamped semiconductor optical amplifier (hereinafter, referred to as "SOA") capable of providing substantially constant gain for output optical signals at all times.

2. Description of the Related Art

When reaching the gain saturation region, an SOA cannot perform its function as an amplifier due to a crosstalk effect that is generated among channels. In order to prevent such a gain saturation phenomenon, it has been used to induce lasing in the SOAs, so as to clamp the gain of the amplifiers.

The lasing apparatus, which are used to clamp the gain of the SOAs, are largely classified according to the method. One is the Distributed Feedback (DFB) method and the other is the Distributed Bragg Reflector (DBR) method.

Figure 1:
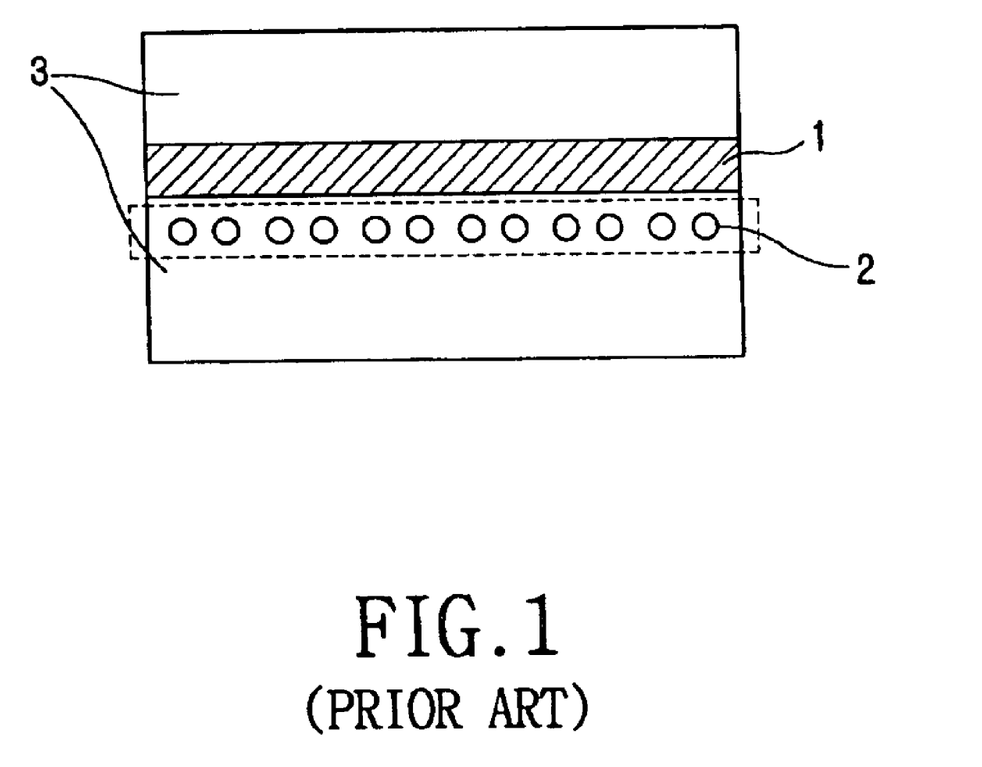
FIG. 1 is a schematic construction of a conventional gain-clamped SOA employing the Distributed Feedback method.

FIG. 1 is a schematic construction of a conventional gain-clamped SOA employing the Distributed Feedback method. The SOA, in which the Distributed Feedback method is applied, has a structure incorporating a grating 2 on the underside of a active waveguide 1 in the amplifier. The structure may be constructed according to the same method as the construction method of a general SOA, except adding a grating 2 in the structure of the general SOA including a active waveguide 1 and clad layers 3.

In the Distributed Feedback method, a grating is formed under the active waveguide having electric carrier density and the photon density varies according to input of an electric current and an optical signal. Consequently, the effective grating pitch of the grating varies. The variation of the effective grating pitch of the grating causes instability of the laser formed by the grating. Therefore, because the gain property of the SOA is unstable, it is difficult to obtain a stable clamped gain property as originally purposed.

The Distributed Bragg Reflector method has a structure wherein (1) a passive waveguide is formed adjacent to the outer part of a active waveguide and (2) a grating is formed on the underside of the passive waveguide. In order to achieve this structure, the "butt-joint" connecting the passive waveguide and the active waveguide directly or a dual waveguide structure arraying a passive waveguide and a active waveguide side by side must be employed. However, this arrangement has a disadvantage in that the construction and manufacture of the waveguide structure are relatively difficult as compared to the Distributed Feedback method. Also, the optical coupling efficiency between the passive waveguide and the active waveguide largely affects the properties of the SOA.

As the Distributed Bragg Reflector method includes a grating formed on the underside of the passive waveguide, a variation of electron density from input of electric current is not generated. Thus, the effective grating pitch varies little. Therefore, a stable laser may be obtained and the gain property of the SOA is also stabilized. However, it is necessary to form a passive waveguide on the outer part of a active waveguide for such a structure, which has its difficulties.

Figure 2:
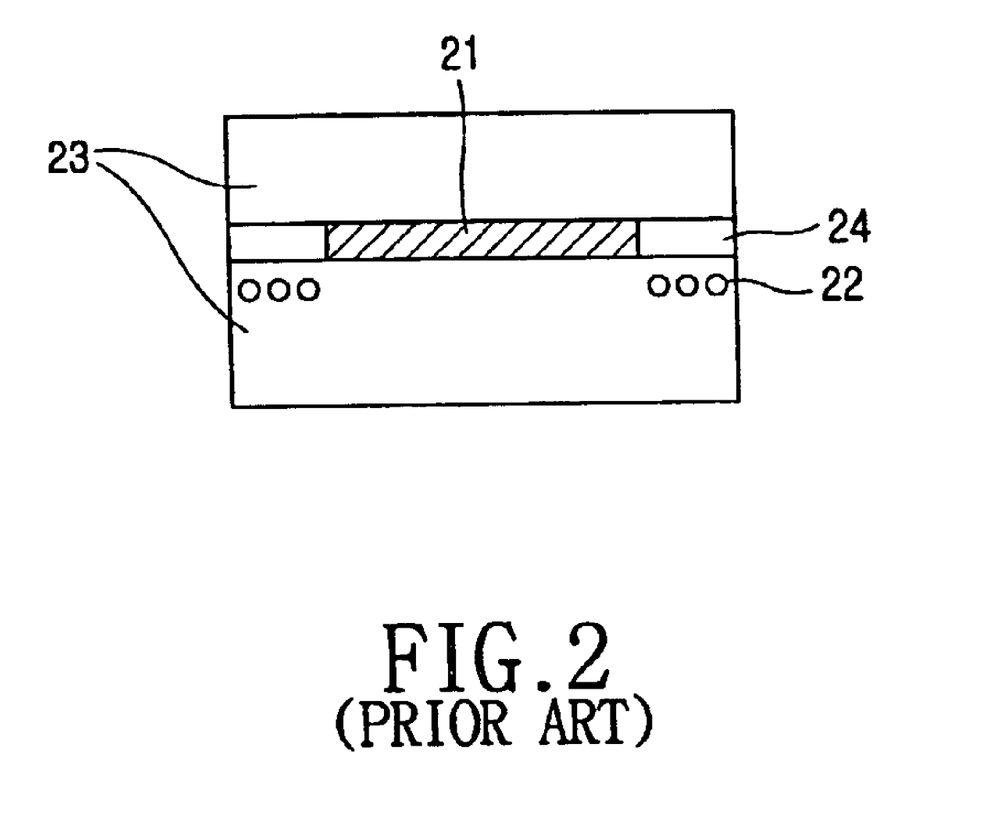
FIG. 2 is a schematic construction of a gain-clamped SOA employing the Distributed Bragg Reflector method using a butt-joint.

In particular, there are two ways to form a passive waveguide on the outer part of a active waveguide as follows. First, as shown in FIG. 2, there is the butt-joint which forms and connects a passive waveguide 24 at the end part of a active waveguide 21. FIG. 2 is a schematic construction of a gain-clamped SOA employing the Distributed Bragg Reflector method using a butt-joint. In FIG. 2, reference number 22 designates a grating and reference number 23 designates clad layers.

However, the gain-clamped SOA of the Distributed Bragg Reflector method using a butt-joint has a number of limitations, for example, manufacturing is difficult, the reflection between the active waveguide and the passive waveguide is large, and the properties of the amplifier are degraded because of the optical coupling loss between the passive waveguide and the active waveguide.

Figure 3:
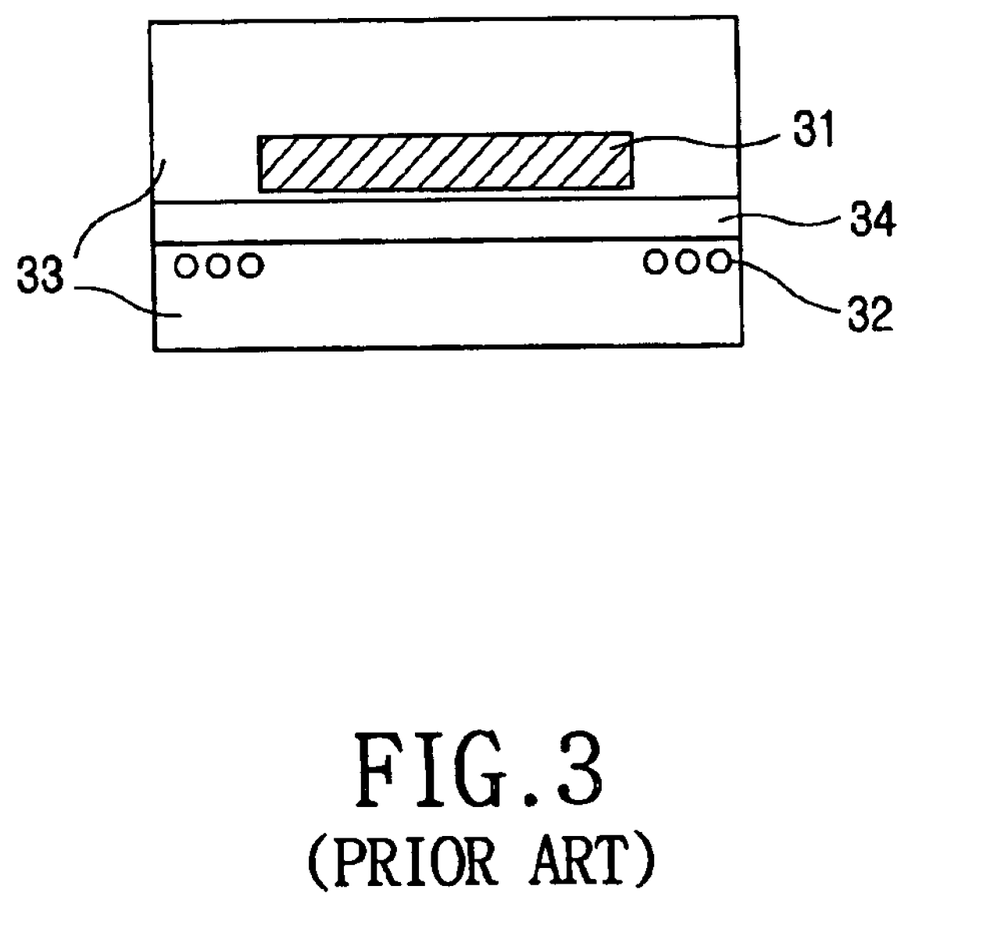
FIG. 3 is a schematic construction of a gain-clamped SOA employing the Distributed Bragg Reflector method using a dual waveguide.

Secondly, the other method to form a passive waveguide on the outer part of a active waveguide is to use a dual waveguide as shown in FIG. 3. The gain-clamped SOA using the dual waveguide, in which a active waveguide 31 and a passive waveguide 34 are formed side by side in a side view. This structure has active waveguide 31 positioned at central part with shorter length than passive waveguide 34. In operation, light passing through passive waveguide 34 moves to active waveguide 31 to obtain gain, and then moves again to passive waveguide 34 to pass. In FIG. 3, reference number 32 designates a grating and reference number 33 designates clad layers respectively.

However, because the dual waveguide structure also has limitations, including the optical coupling efficiency between the active waveguide and the passive waveguide, there is a problem in that the properties of the amplifier are adversely affected.

SUMMARY OF THE INVENTION

Accordingly, the present invention has been made to reduce or overcome the above-mentioned limitations occurring in the prior art. One aspect of the present invention is to provide a semiconductor optical amplifier capable of producing a stable laser with only one active waveguide, instead of a construction including both a active waveguide and a passive waveguide separated from each other.

In accordance with the principles of the present invention a gain-clamped semiconductor optical amplifier includes a active waveguide, clad layers surrounding the active waveguide, and a grating, which is formed partially at both end parts under the input and output sides of the active waveguide.

In one illustrative embodiment, the grating is asymmetrically formed so that the input and output sides of the laser have different reflection factors from each other.

In an other illustrative embodiment, the active waveguide further comprises mode converters each of which is formed on a portion of each end part of the active waveguide in order to improve the optical coupling efficiency for an optical fiber, and the grating is formed on positions inward from each mode alteration area, respectively, so as to avoid the mode alteration area.

BRIEF DESCRIPTION OF THE DRAWINGS

The present invention will be more apparent from the following detailed description taken in conjunction with the accompanying drawings, in which.

DETAILED DESCRIPTION OF THE PREFERRED EMBODIMENT

Hereinafter, a gain-clamped semiconductor optical amplifier according to preferred embodiments of the present invention will be described with reference to the accompanying drawings. It is noted that the same elements, although depicted in different drawings, are indicated with the same reference numerals or marks. For the purposes of clarity and simplicity, a detailed description of known functions and configurations incorporated herein will be omitted as it may make the subject matter of the present invention rather unclear.

Figure 4:
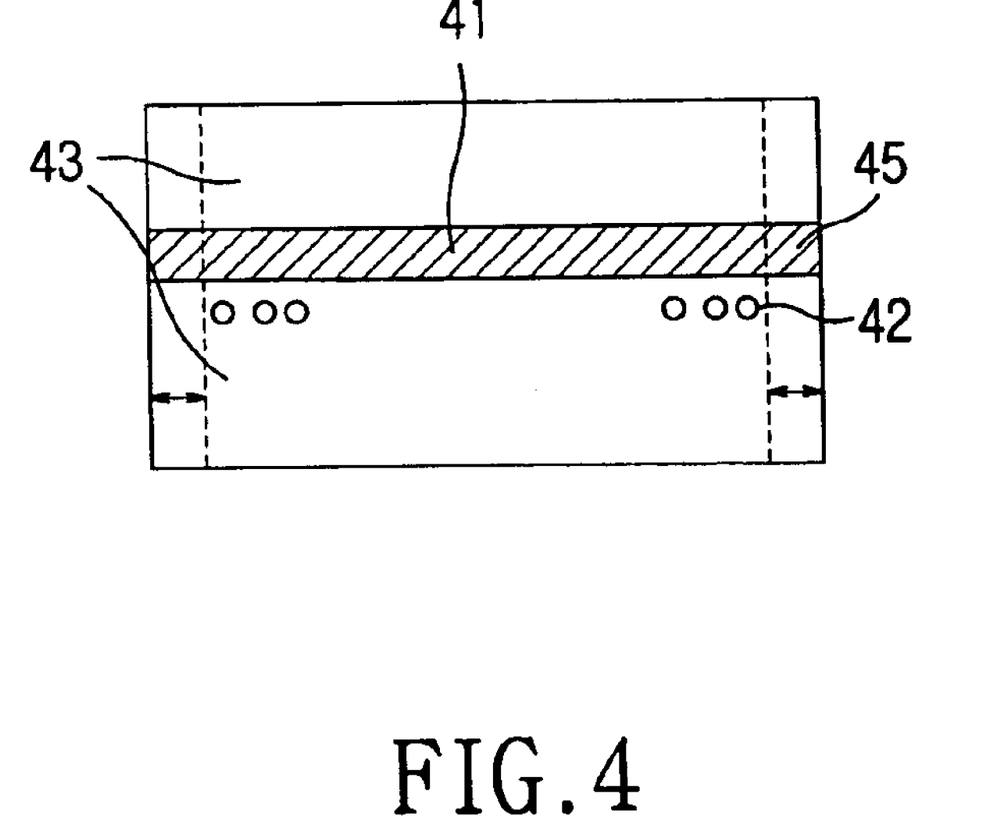
FIG. 4 is a schematic construction of a gain-clamped SOA according to a preferred embodiment of the present invention.
Figure 5:
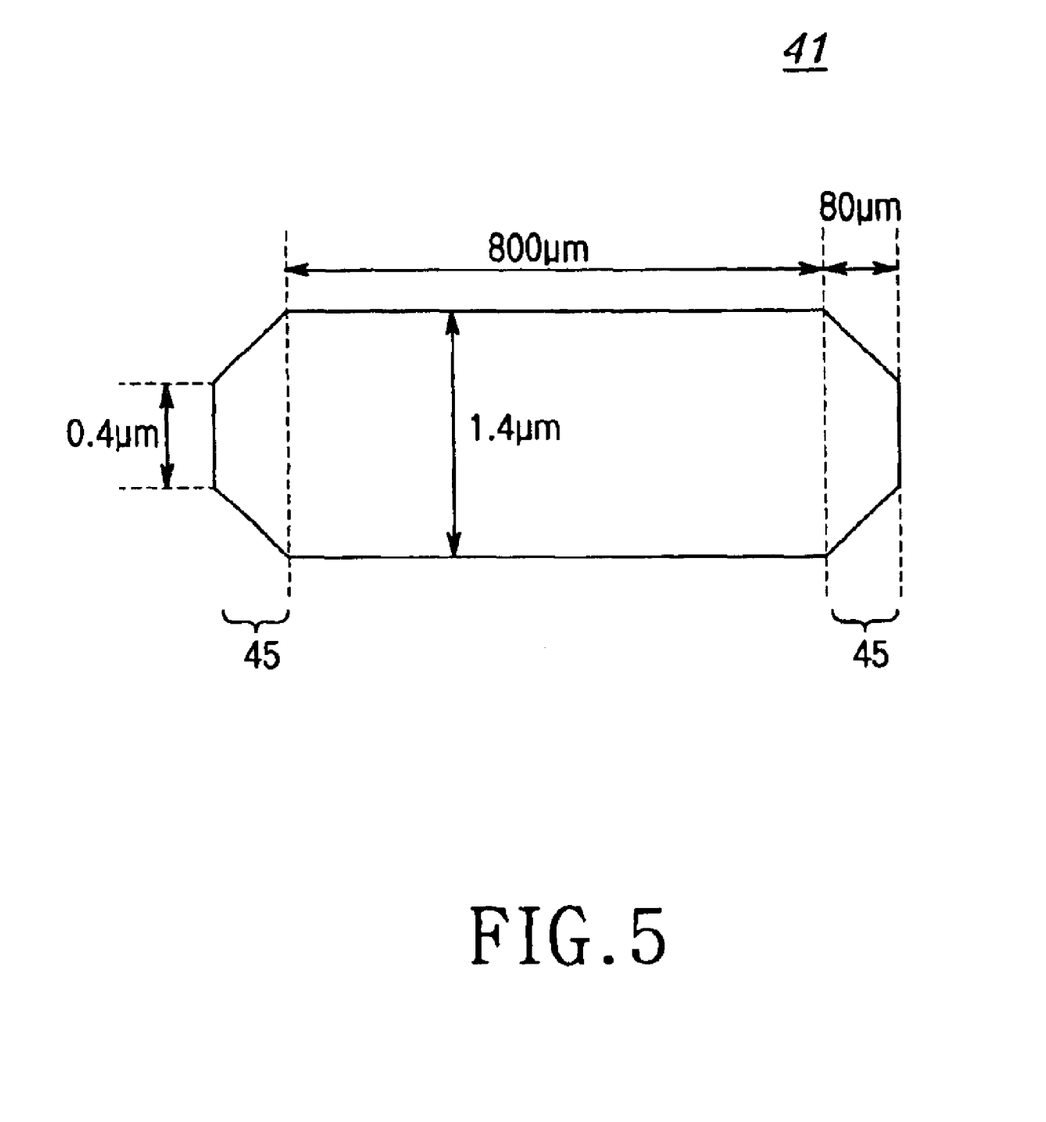
FIG. 5 is a view illustrating the plan structure of a active waveguide applied in a gain-clamped SOA according to the present invention.

FIG. 4 is a schematic construction of a gain-clamped SOA according to a one illustrative embodiment of the present invention. FIG. 5 is a plan view illustrating the structure of the active waveguide shown in FIG. 4.

Referring to FIG. 4, semiconductor optical amplifier (SOA) according to the present invention includes a active waveguide 41, clad layers 43 enclosing the active waveguide 41, and a grating 42 formed under the active waveguide 41. The grating 42, unlike the Distributed Feedback (DFB) method in forming a grating throughout the whole length of the waveguide under the active waveguide, is partially formed only at both end parts of the waveguide under the active waveguide 41. Therefore, the lasing property of the gain-clamped SOA according to the present invention uses some basics from the Distributed Bragg Reflector (DBR) method, not the DFB method. As the grating 42, unlike a grating of the DBR method having a passive waveguide, is formed under the active waveguide 41, the effective refractive index varies according to the input of electric currents and optical signals. However, the length of the grating 42 suffering from such a variation is relatively short as compared to the DFB method, and it is shown that the lasing mode basically doesn't suffer much variation even though the effective refractive index varies under the lasing according to the DBR method. Even if, the lasing mode is changed, it doesn't show an abrupt change in the DBR mode lasing unlike the DFB mode lasing and it doesn't give much variation to the gain property of the gain-clamped SOA. Also, As the gain-clamped SOA of the present invention doesn't need a passive waveguide, there is no loss and no reflection caused by optical coupling between a active waveguide and a passive waveguide.

Meanwhile, active waveguide 41, as shown in FIG. 5, includes a mode converters 45 for increasing optical coupling efficiency for an optical fiber.

A detailed embodiment of SOA according to the present invention is as follows.

Referring now to both FIGS. 4 and 5, active waveguide 41 is made from an InGaAsP which can amplify input signals with a wavelength of about 1550 nm, with a thickness of 600 Å, a width of 1.41 $\mu$m, and a length of 960 $\mu$m. Each 80 $\mu$m of both end parts in active waveguide 41 comprises, (with the same substrate as the other part of active waveguide 41 in order to increase optical coupling efficiency for an optical fiber) a mode alteration area 45 which has a width continuously varying from 1.4 $\mu$m to 0.4 $\mu$m. Clad layers 43 enclosing outer sides of active waveguide 41 are made from an InP. Grating 42 is made from an InGaAs with a thickness of 200 Å, and the distance from the upper end of grating 42 to the lower end of active waveguide 41 is 1,000 Å. Also, each of the input and output sides of grating 42 has a length of 100 $\mu$m. Further, the input and output sides of grating 42 are formed on areas starting from positions distanced 100 $\mu$m from the incident plane and the output plane, respectively, so as to avoid mode alteration area 45. In mode alteration area 45, as the width of active waveguide 41 is altered, the effective refractive index is also altered. If grating 42 is formed under mode alteration area 45, an alteration of the effective grating pitch is caused, thus it is difficult to obtain a stable lasing property. Like the general SOA, the input and output facets are finished with a non-reflection coating in order to avoid causing reflection on both planes, active waveguide 41 is tilted to have an angle of 7° with respect to a plane perpendicular to both input and output facets (not shown) and also is begun from each position which is 20 $\mu$m from each of the both input and output facets.

The embodiment described above has shown that grating 42 has a symmetrical structure at both end parts of the waveguide on the underside of active waveguide 41. However, the symmetrical structure is not necessarily required in grating 42. It is possible to adjust the reflection factors of the laser on the input/output sides of grating 42 by differing the lengths of the input/output sides from each other. Also, it is possible to alter laser power and electric carrier density in the input/output sides of grating 42, which can be adjusted in order to obtain desired output characteristics. For example, when the input side of grating 42 is formed with a larger length than the output side thereof so as to enable the input side to have a larger laser reflection factor than the output side, the output end of active waveguide 41 has a higher laser power than the input end thereof while the input end has a higher electric carrier density than the output end. The input end of active waveguide 41, which has a higher electric carrier density than the output end thereof as described above, is more advantageous in improving the noise characteristics of amplifier having a noise property which is more affected by the input end than the output end.

Figure 6:
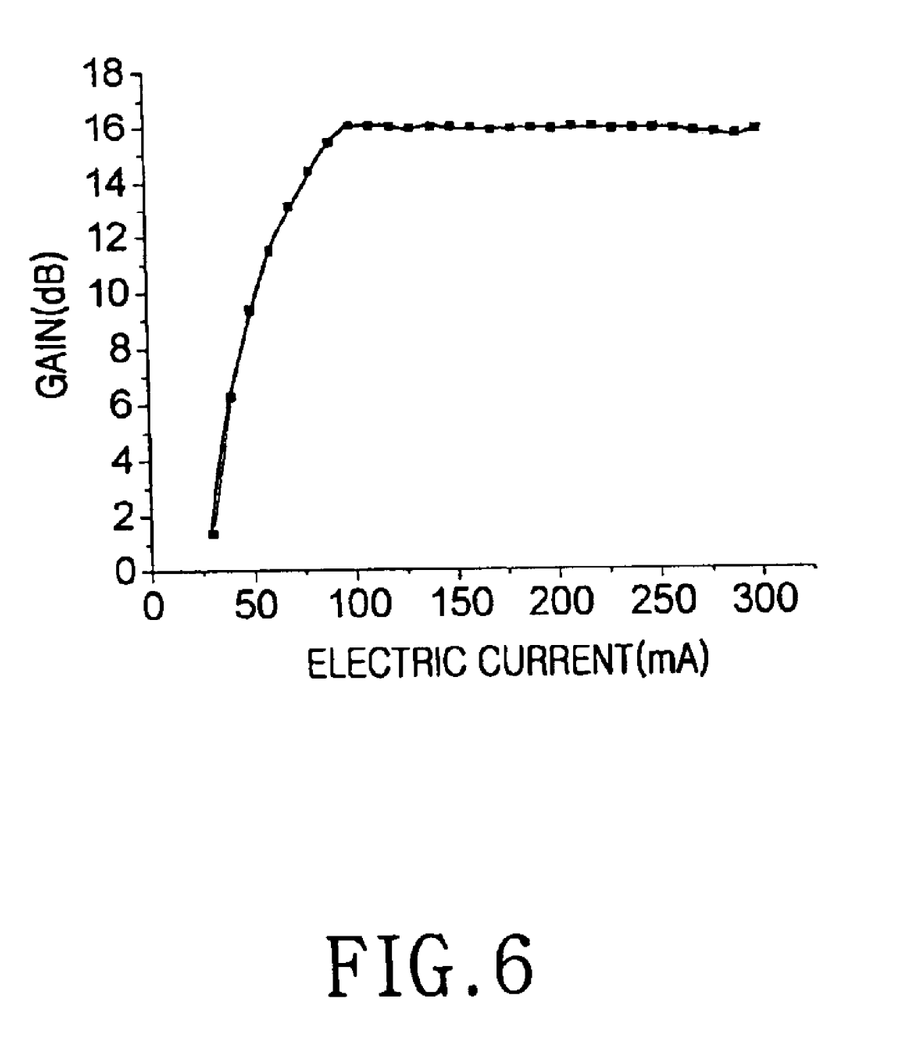
FIG. 6 is a graph showing gain property on the basis of applied electric current in a gain-clamped SOA according to the present invention.

FIG. 6 is a graph showing gain property on the basis of applied electric current in a gain-clamped SOA according to the present invention. As shown in FIG. 6, it can be seen that the gain is constantly maintained after arriving at a gain of 16 dB at an electric current of 100 mA, even though the electric current is continuously increased.

Figure 7:
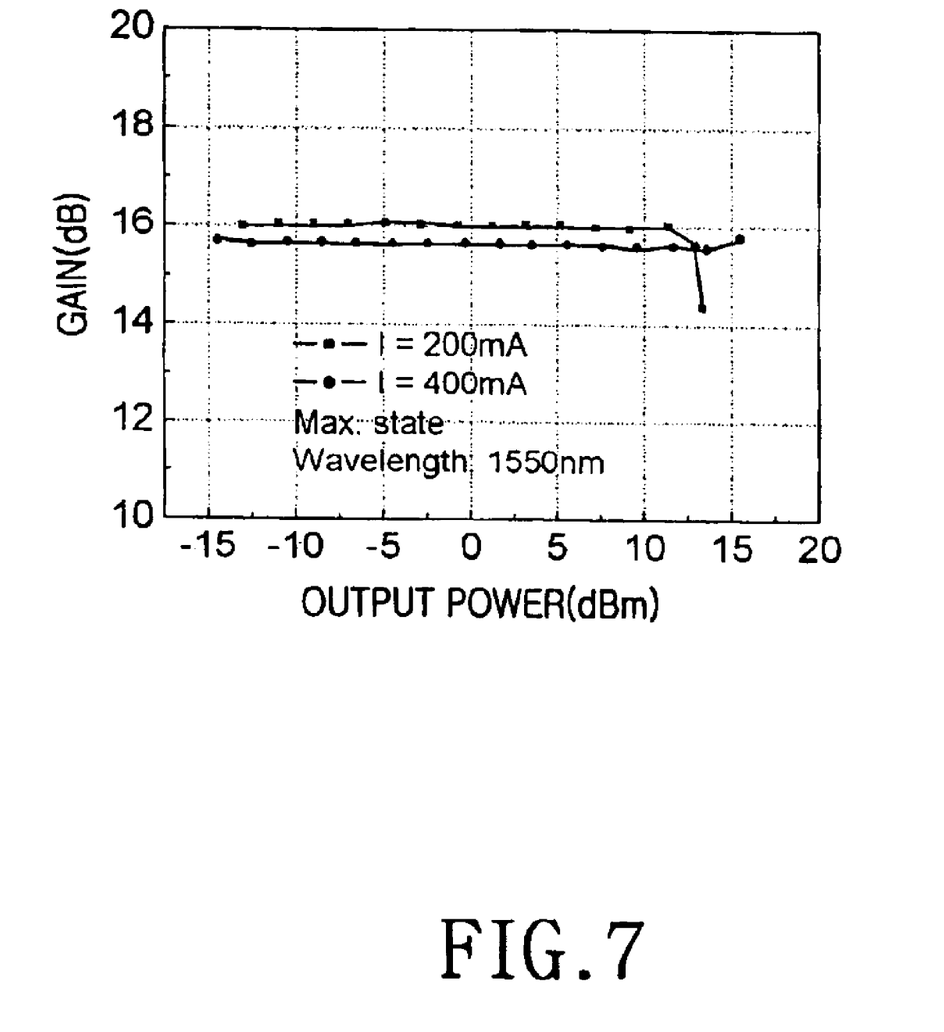
FIG. 7 is a graph showing gain property on the basis of output power in a gain-clamped SOA according to the present invention.

FIG. 7 is a graph showing gain property on the basis of output power in a gain-clamped SOA according to the present invention. The graph shows a result of a test which inputs optical signals having different power from each other and measures output powers at driving electric currents of 200 mA and 400 mA respectively. In the electric current of 200 mA, the gain is not saturated until the output power arrives at 12 dBm. In the electric current of 400 mA, it can be seen that the gain doesn't see a gain saturation phenomenon even though the output power arrives at 15 dBm.

As described above, the gain-clamped SOA according to the present invention comprises a grating formed only at both end parts of active waveguide, so that it is possible to stably obtain the laser needed for gain clamping of the optical amplifier.

Also, as the gain-clamped SOA of the present invention doesn't require a passive waveguide, the additional process for forming a passive waveguide is not needed.

Furthermore, the gain-clamped SOA of the present invention has none of the optical amplifier's property degradation caused by optical coupling loss between a active waveguide and a passive waveguide.

Accordingly, it is possible to provide a semiconductor optical amplifier having stable gain-clamped properties with a simple manufacturing process.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A gain-clamped semiconductor optical amplifier comprising:

an active waveguide having an input and output side;

clad layers surrounding the active waveguide; and a grating, which is formed partially at both end parts of the input and output sides under the active waveguide, and wherein the semiconductor device does not include a passive waveguide for light to pass after obtaining gain by passage in the active waveguide.

2. The optical amplifier as claimed in claim 1, wherein the grating is asymmetrically formed so that the input and output sides of the active waveguide have different reflection factors from each other.

3. The optical amplifier as claimed in claim 1, wherein the active waveguide further comprises at least one mode alteration area, formed on a portion of each end part of the active waveguide for use in optical coupling for an optical fiber.

4. The optical amplifier as claimed in claim 3, wherein the grating is formed on positions inward from each mode alteration area, respectively.

5. The optical amplifier as claimed in claim 1, wherein the active waveguide is made from an lnGaAs or InGaAsP.

6. The optical amplifier as claimed in claim 1, wherein the active waveguide is formed with a length of 300 to 1500 $\mu$m, a width of 0.8 to 3.0 $\mu$m, and a thickness of 400 to 3000 Å.

7. The optical amplifier as claimed in claim 5, wherein the grating is made from an InP in which InGaAs or InGaAsP is periodically formed.

8. The optical amplifier as claimed in claim 1, wherein the grating is formed so that a length of one grating is 1/300 to 1/3 of the whole length of the active waveguide, a thickness of one grating is 50 to 500 Å, and a separation between the upper end of the grating and the lower end of the active waveguide is 500 to 3000 Å.

9. The optical amplifier as claimed in claim 2, wherein the input side of the grating has a reflection factor which is 4 to 100 times as high as that of the output side of the grating.

10. The optical amplifier as claimed in claim 3, wherein the mode alteration area has a length of 30 to 300 $\mu$m.

11. The optical amplifier as claimed in claim 2, wherein the active waveguide further comprises at least one mode alteration area, formed on a portion of each end part of the active waveguide for use in optical coupling for an optical fiber.

12. A gain-clamped semiconductor optical amplifier comprising:

a active waveguide;

clad layers surrounding the active waveguide; and a grating that is formed under a portion of the active waveguide; and wherein said device does not include a passive waveguide adapted for light to pass after obtaining gain by passage in the active waveguide.

13. The optical amplifier as claimed in claim 12, wherein the portion of grating is at least formed under one of an input and output sides of the active waveguide.

14. The optical amplifier as claimed in claim 12, further includes at least one mode alteration area, formed on a portion of each end part of the active waveguide for use in optical coupling for an optical fiber.

* * * * *